United States Patent
Dau et al.

(10) Patent No.: US 8,192,051 B2
(45) Date of Patent: Jun. 5, 2012

(54) BIDIRECTIONAL LED LIGHT SHEET

(75) Inventors: Wilson Dau, Calgary (CA); Louis Lerman, Las Vegas, NV (US); Allan Brent York, Langley (CA)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 12/917,327

(22) Filed: Nov. 1, 2010

(65) Prior Publication Data

US 2011/0063838 A1    Mar. 17, 2011

(51) Int. Cl.
*F21S 4/00*    (2006.01)
*F21S 8/04*    (2006.01)
*F21V 23/06*    (2006.01)

(52) U.S. Cl. ............. 362/249.02; 362/249.06; 362/97.3; 362/240

(58) Field of Classification Search .................. 362/97.3, 362/147, 236, 240, 242, 244, 249.02, 249.06
See application file for complete search history.

(56) References Cited

U.S. PATENT DOCUMENTS

| | | | |
|---|---|---|---|
| 4,445,132 A | 4/1984 | Ichikawa et al. | |
| 5,884,994 A | 3/1999 | Herst et al. | |
| 5,925,897 A | 7/1999 | Oberman | |
| 6,087,680 A | 7/2000 | Gramann et al. | |
| 6,113,433 A | 9/2000 | Al-Turki | |
| 6,270,236 B1 * | 8/2001 | Brussog ........................ | 362/235 |
| 6,541,908 B1 | 4/2003 | Cheung et al. | |
| 6,557,393 B1 | 5/2003 | Gokhfeld et al. | |
| 6,693,551 B2 | 2/2004 | Pederson | |
| 6,786,621 B2 | 9/2004 | Sviland | |
| 6,876,143 B2 | 4/2005 | Daniels | |
| 6,936,855 B1 | 8/2005 | Harrah | |
| 7,052,924 B2 | 5/2006 | Daniels et al. | |
| 7,217,956 B2 | 5/2007 | Daniels et al. | |
| 7,259,030 B2 | 8/2007 | Daniels et al. | |
| 7,378,124 B2 | 5/2008 | Daniels | |
| 7,427,782 B2 | 9/2008 | Daniels et al. | |
| 7,476,557 B2 | 1/2009 | Daniels et al. | |
| 7,609,006 B2 | 10/2009 | Gibboney | |
| 7,745,838 B2 * | 6/2010 | Lefevre ........................... | 257/88 |

(Continued)

FOREIGN PATENT DOCUMENTS

EP    2159780    3/2010

(Continued)

OTHER PUBLICATIONS

"Why pay for the lamp when you just need the light?," Lightsheet, Articulux, Articulated Technologies web page downloaded on Aug. 27, 2010 from http://www.buylightsheet.com/, 1 page.

(Continued)

*Primary Examiner* — Ismael Negron
(74) *Attorney, Agent, or Firm* — Fish & Richardson P.C.

(57) ABSTRACT

A bidirectional light sheet including at least a first and second array of bare LED chips with top and bottom electrodes, where the arrays of LEDs are sandwiched between at least two transparent substrates having conductors bonded to the electrodes without wires to form the light sheet. The LEDs of the array are arranged within the light sheets to emit light from opposite surfaces of the light sheet to create a bidirectional light sheet. The bidirectional light sheet is suspended from a ceiling to be non-parallel to the ceiling.

17 Claims, 3 Drawing Sheets

U.S. PATENT DOCUMENTS

| | | | |
|---|---|---|---|
| 7,777,166 | B2 | 8/2010 | Roberts |
| 7,858,994 | B2 | 12/2010 | Daniels |
| 2002/0149933 | A1 | 10/2002 | Archer et al. |
| 2003/0160256 | A1 | 8/2003 | Durocher et al. |
| 2004/0189218 | A1 | 9/2004 | Leong et al. |
| 2005/0174769 | A1 | 8/2005 | Yong et al. |
| 2005/0207152 | A1 | 9/2005 | Maxik |
| 2005/0207156 | A1 | 9/2005 | Wang et al. |
| 2005/0265024 | A1 | 12/2005 | Luk |
| 2006/0221606 | A1 | 10/2006 | Dowling |
| 2007/0090387 | A1 | 4/2007 | Daniels et al. |
| 2007/0103066 | A1 | 5/2007 | D'Andrade et al. |
| 2007/0126354 | A1 | 6/2007 | Chao |
| 2007/0228999 | A1 | 10/2007 | Kit |
| 2007/0241355 | A1 | 10/2007 | Chua |
| 2008/0079012 | A1 | 4/2008 | Grote et al. |
| 2008/0080163 | A1 | 4/2008 | Grote III et al. |
| 2008/0080200 | A1 | 4/2008 | Robbins et al. |
| 2008/0089069 | A1 | 4/2008 | Medendorp |
| 2008/0238338 | A1 | 10/2008 | Latham et al. |
| 2008/0238649 | A1 | 10/2008 | Arszman et al. |
| 2009/0046457 | A1 | 2/2009 | Everhart |
| 2009/0114928 | A1 | 5/2009 | Messere et al. |
| 2009/0195787 | A1 | 8/2009 | Granados et al. |
| 2009/0237916 | A1 | 9/2009 | Park |
| 2009/0261357 | A1 | 10/2009 | Daniels |
| 2009/0261743 | A1 | 10/2009 | Chen et al. |
| 2010/0044589 | A1 | 2/2010 | Garcia et al. |
| 2010/0084665 | A1 | 4/2010 | Daniels et al. |
| 2010/0102729 | A1 | 4/2010 | Katzir et al. |
| 2010/0164344 | A1 | 7/2010 | Boerner et al. |
| 2010/0308353 | A1 | 12/2010 | Grabowski et al. |
| 2010/0317132 | A1 | 12/2010 | Rogers et al. |
| 2011/0050073 | A1 | 3/2011 | Huang |
| 2011/0069487 | A1 | 3/2011 | Ng et al. |
| 2011/0133658 | A1 | 6/2011 | Sauerlaender |
| 2011/0170288 | A1 | 7/2011 | Kim |
| 2011/0180818 | A1 | 7/2011 | Lerman et al. |
| 2011/0260741 | A1 | 10/2011 | Weaver et al. |
| 2011/0298371 | A1 | 12/2011 | Brandes et al. |

FOREIGN PATENT DOCUMENTS

| | | |
|---|---|---|
| JP | 61-198690 | 9/1986 |
| JP | 08-018105 | 1/1996 |
| WO | WO2005/099310 | 10/2005 |

OTHER PUBLICATIONS

"A Breakthrought in LED Technology," Lightsheet™ versus the other LED Manufacturing Technology, Lightsheet, Articulux, Articulated Technologiesweb page downloaded on Aug. 27, 2010 from http://www.buylightsheet.com/how, html, 1 page.

"Competitive Advantage of Lightsheet™ Technology," Articulated Technologies white paper, 4 pages.

S. W. Rickly Lee et al., "Process Development and Prototyping for the Assembly of LED Arrays on Flexible Printed Circuit Tape for General Solid State Lighting," 2009 IEEE, 2009 Electronic Components and Technology Conference, pp. 2137-2142.

James Gourlay et al., "79.4: Light-Rolls: High Throughput Manufacture for LED Lighting and Displays," SID 2010 Digest, pp. 1184-1187.

Konstantinos A. Sierros et al., "59.2: Durable Solid State Flexible LED Devices," SID 2010 Digest, pp. 882-885.

James Gourlay et al., "74.2: High Efficiency Hybrid LED Backlight for Large-area LCD TV," 2010 SID Digest, pp. 1097-1099.

English translation of Japanese Patent No. JP61-19869, 11 pages.

English translation of Japanese Patent No. JP08-018105, 12 pages.

U.S. Appl. No. 12/870,760, filed Aug. 27, 2010, Solid State Light Sheet for General Illumination, Lerman, et al.

U.S. Appl. No. 12/917,319, filed Nov. 1, 2010, Solid State Bidirectional Light Sheet for General Illumination, Lerman, et al.

U.S. Appl. No. 13/018,330, filed Jan. 31, 2011, Solid State Light Sheet Using Thin LEDs for General Illumination, Lerman, et al.

U.S. Appl. No. 13/032,502, filed Feb. 22, 2011, Solid State Lamp Using Light Emitting Strips, Steele, et al.

U.S. Appl. No. 13/032,510, filed Feb. 22, 2011, Solid State Lamp Using Modular Light Emitting Elements, Dau, et al.

U.S. Appl. No. 13/044,456, filed Mar. 9, 2011, Manufacturing Methods for Solid State Light Sheet or Strip With LEDs Connected in a Series for General Illumination, Lerman, et al.

U.S. Appl. No. 13/079,706, filed Apr. 4, 2011, Solid State Light Sheet for General Illumination Having Substrates for Creating Series Connection of Dies, Lerman, et al.

U.S. Appl. No. 13/079,717, filed Apr. 4, 2011, Solid State Light Sheet for General Illumination Having Metal Interconnector Through Layer for Connecting Dies in Series, Lerman, et al.

U.S. Appl. No. 13/096,814, filed Apr. 28, 2011, Solid State Light Sheet or Strip Having Cavities Formed in Bottom Substrate, Lerman, et al.

U.S. Appl. No. 13/096,846, filed Apr. 28, 2011, Solid State Light Strips Containing LED Dies in a Series, Lerman, et al.

U.S. Appl. No. 13/100,231, filed May 3, 2011, Solid State Light Sheet Having Wide Support Substrate and Narrow Strips Enclosing LED Dies in Series, Lerman, et al.

U.S. Appl. No. 13/100,247, filed May 3, 2011, Solid State Light Sheet or Strip Having Cavities Formed in Top Substrate, Lerman, et al.

LED Bulb with 5W Power Consumption. product description, downloaded on Nov. 22, 2010 from http://www.best-b2b.com/Products/867/890-2/led-bulb-with-5w-power-consumption_417... pp. 1-2.

Vergoosen, Invitation to Pay Additional Fees in PCT/US2011/049233 dated Dec. 22, 1011, 7 pages.

\* cited by examiner

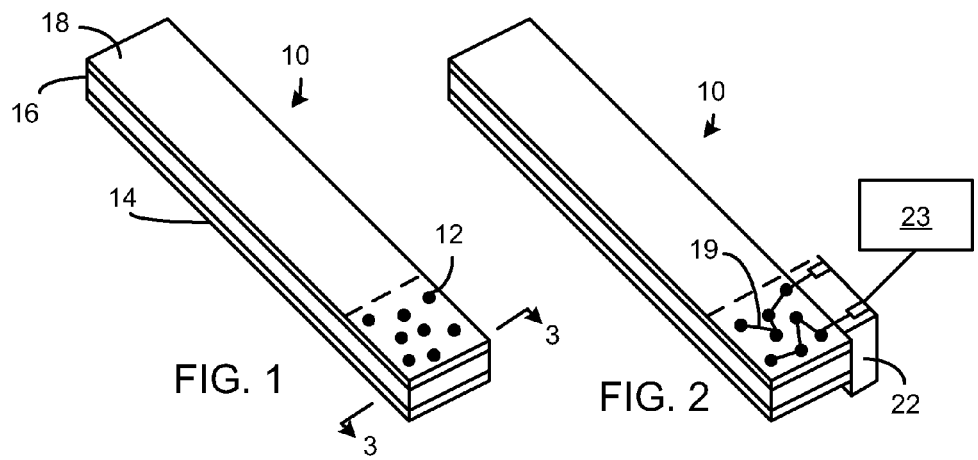
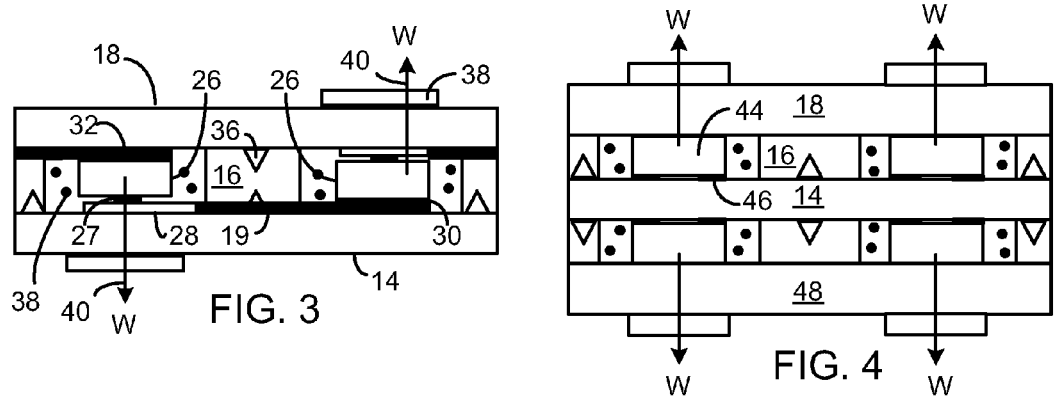
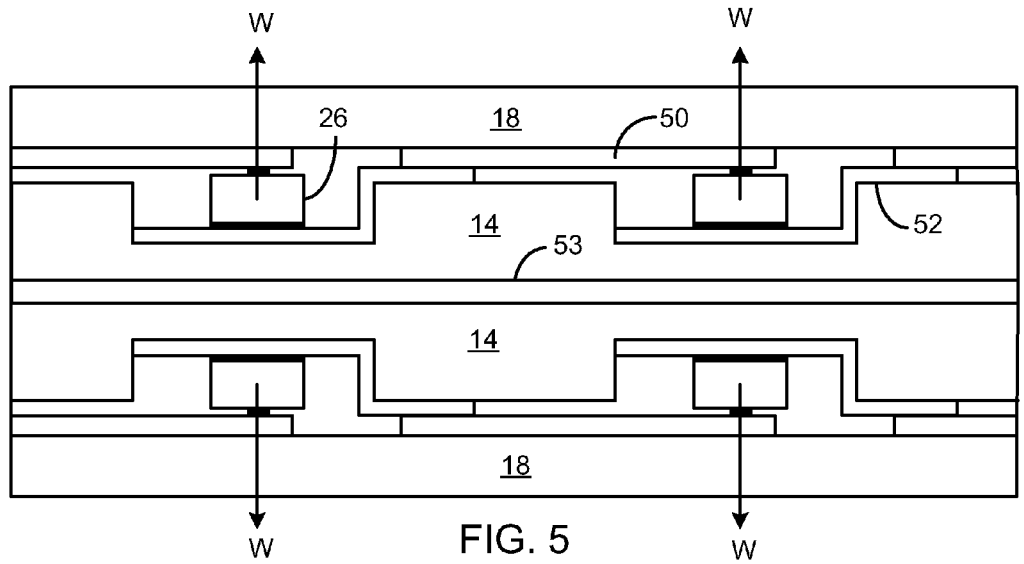

BIDIRECTIONAL LED LIGHT SHEET

FIELD OF INVENTION

This invention relates to solid state illumination and, in particular, to a substantially flat bidirectional light sheet containing light emitting dies, such as light emitting diodes (LEDs), where the light sheet is orientated at a non-parallel angle, such as vertically, with respect to a ceiling.

BACKGROUND

High power LEDs are the conventional choice for general solid state lighting applications. Such high power white LEDs are extremely bright and can have luminous efficacies between 100 and 200 lumens/watt. The input power of a single high-power LED is typically greater than 0.5 watt and may be greater than 10 watts. Such LEDs generate considerable heat since they are only about 1 mm$^2$ in area, so the required packaging is fairly complex and expensive. Although a bare high-power LED chip typically costs well under $1.00 (e.g., $0.10), the packaged LED typically costs around $1.50-$3.00. This makes a high output (e.g., 3000+ lumens) solid state luminaire relatively expensive and not a commercially feasible alternative for a fluorescent light fixture, commonly used for general illumination. Further, the optics required to convert the high brightness point sources into a substantially homogeneous, broad angle emission for an office environment (where glare control is important) is extremely challenging.

To greatly reduce the cost of a large area, high lumen output light source, it is known to sandwich an array of bare LED dice between a reflective bottom sheet having conductors and a top transparent sheet having conductors. The LEDs have top and bottom electrodes that contact a set of conductors. When the conductors on the sheets are energized, the LEDs emit light through only the transparent sheet. The light sheet may be flexible.

Such prior art light sheets are not bidirectional.

It is also well known to provide a light emitting panel as a luminaire for general illumination, where the panel is oriented so that its light emitting surface is parallel to a floor.

It may be desirable in certain environments to provide a cost-effective luminaire that generates lighting effects other than those of the above-described prior art luminaires.

SUMMARY

Bidirectional light sheets and novel orientations of the light sheets are described. The light sheets can be formed to have any dimensions, including narrow strips.

In one embodiment, an array of bare light emitting diode (LED) chips, having top electrodes and bottom electrodes, are sandwiched between two or more substrates having conductors formed on their surfaces. LEDs with top and bottom electrodes are typically referred to as vertical LEDs. The bottom electrode of commercially available vertical LEDs is reflective and covers the entire bottom surface of the LED. Therefore, the typical vertical LED emits light only from its top surface and sides. The top electrode is intended by the LED manufacturer to be bonded to a thin wire using ultrasonic bonding or other bonding technique.

The light sheets used in embodiments of the present invention employ conductors on the substrates that electrically contact the LED electrodes without using wires. The conductors may connect any number of LEDs in series and are ultimately connected to a power source. In another embodiment, wires may be used for the connections, adding considerable cost and complexity to the light sheet.

In one embodiment, the orientations of the vertical LEDs are alternated so that the conductors on the substrates connect an anode of one LED to the cathode of the adjacent LED for a series connection. In this way, the LEDs having one orientation emit light in one general direction, and LEDs having the opposite orientation emit light in the opposite direction. Therefore, the light sheet emits bidirectional light. Reflectors (e.g., prisms) in the substrates may be used to direct any side light toward the desired light output surface of the sheet.

In other embodiments, two light sheets are effectively affixed back-to-back, where the light sheets emit light in opposite directions to form a bidirectional light sheet. A reflective sheet may be used as an intermediate layer between the opposing light sheets.

In one embodiment, control electronics may be located on or in an intermediate layer between the light sheets.

In an application of a bidirectional light sheet, the sheet (e.g., a strip) may be suspended from a ceiling so that it is orientated vertically (i.e., perpendicular to the ceiling and floor). Optics may be molded into the light emitting surfaces to angle the peak light intensity downward (e.g., at 55 degrees relative to vertical) to avoid glare and to merge the light of one fixture with light from adjacent fixtures. Other ways of directing the light may also be used, such as locating the LED chips in reflective cups or deep wells that emit a collimated beam of light at any selected angle. Portions of the light sheet, or another light sheet in the same fixture, may also be designed to direct light upward to reflect off the ceiling to achieve broad illumination. Any combinations of peak intensity angles may be achieved.

In one embodiment, a luminaire is created with a plurality of pivotable bidirectional light sheets so the user can customize the light emission pattern. In another embodiment, the flexible light sheet may be formed as a cylinder and suspended from the ceiling to provide uniform illumination of the floor and ceiling. In another embodiment, the light sheet may be formed as a truncated pyramid and suspended from the ceiling.

Light emitting dies other than LEDs may also be used.

Other variations are described herein.

BRIEF DESCRIPTION OF THE DRAWINGS

The below described drawings are presented to illustrate some possible examples of the invention.

FIG. 1 is a simplified perspective view of a portion of a bidirectional light sheet, in accordance with one embodiment of the invention, showing some light emitting areas.

FIG. 2 illustrates a series connection of LEDs in the light sheet of FIG. 1.

FIG. 3 is a cross-sectional view along line 3-3 in FIG. 1 showing LEDs in opposite orientations being connected in series.

FIG. 4 is a cross-sectional view along line 3-3 in FIG. 1 showing back-to-back light sheets containing flip-chip LEDs connected in series.

FIG. 5 is a cross-sectional view along line 3-3 in FIG. 1 showing back-to-back light sheets containing vertical LEDs connected in series.

Elements that are the same or similar are labeled with the same numerals.

DETAILED DESCRIPTION

Figure 6:
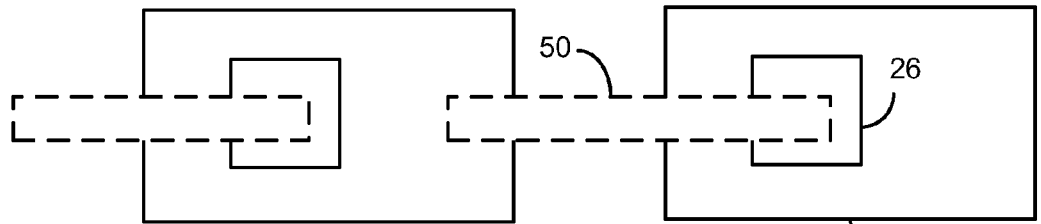
FIG. 6 illustrates a conductor connection in the light sheet of FIG. 5 showing the series connection between adjacent LEDs.

FIG. 1 is a perspective view of a portion of a light sheet 10, showing a simplified pseudo-random pattern of LED areas 12. The LED areas 12 may instead be in an ordered pattern. There may be 500 or more low power LEDs in the light sheet 10 to generate the approximately 3700 lumens (per the DOE CALiPER benchmark test) needed to replace a standard fluorescent fixture typically found in offices.

The pseudo-random pattern may repeat around the light sheet 10 (only the portion within the dashed outline is shown). A pseudo-random pattern is preferred over an ordered pattern since, if one or more LEDs fail or have a poor electrical connection, its absence will be significantly harder to notice.

In one embodiment, the light sheet 10 is generally formed of three main layers: a transparent bottom substrate 14 having an electrode and conductor pattern; an intermediate sheet 16 acting as a spacer and optional reflector; and a transparent top substrate 18 having an electrode and conductor pattern. In one embodiment, the LED chips are electrically connected between electrodes on the bottom substrate 14 and electrodes on the top substrate 18. The light sheet 10 is very thin, such as a few millimeters, and is flexible.

FIG. 2 illustrates a sample pattern of conductors 19 on the top substrate 18 and/or bottom substrate 14 that connect any number of LED chips in series. In the example of FIG. 2, two groups of series-connected LEDs in the LED areas 12 are connected in parallel. The parallel connection may be selected by a customizable interconnector 22 external to the light sheet. The customizable interconnection of the LED chips allows the drive voltage and current to be selected by the customer or be customized for a particular size of light sheet. There may be many strings of LED chips in the light sheet that are connected together in series, parallel, or connected to different power supplies.

A DC or AC power supply 23 is shown connected to the connector 22. An input of the power supply 23 may be connected to the mains voltage. If the voltage drop of an LED series string is sufficiently high, the series string of LEDs may be driven by a rectified mains voltage (e.g., 120 VAC).

As shown in FIG. 3, to achieve a series connection of LED chips using top and bottom conductors, some LEDs chips 26 are mounted on the bottom substrate 14 with their anodes 27 connected to the bottom substrate electrodes 28 and other LED chips 26 are mounted with their cathodes 30 connected to the bottom substrate electrodes 28. Ideally, adjacent LED chips are reversely mounted to simplify the series connection pattern. The conductors 19 between the electrodes then connects the LED chips in series. A similar pattern of conductors 32 on the top substrate 18 connects the cathodes of LED chips 26 to the anodes of adjacent LED chips 26.

In another embodiment, it is also possible to connect the LED chips in two anti-parallel series branches, or derivatives thereof, that will enable the LED chips to be driven directly from AC, such as directly from the mains voltage.

Since the cathodes 30 of the LED chips 26 are typically large reflectors that cover the entire bottom surface of the LED chips, the light emitted from the oppositely orientated LED chips 26 will be in opposite directions. Reflectors 36 molded into the substrates 14/18 or intermediate sheet 16 may be used to reflect side light toward the output surfaces of the light sheet.

If the LED chips 26 emit blue light, phosphor 38 may be deposited over the light path to convert the blue light to white light, as shown by the light rays 40. Phosphor may also be incorporated into an encapsulant that fills the holes in the intermediate sheet 16 surrounding the LED chips 26.

Additional details of the various bidirectional light sheets shown herein may be found in U.S. application Ser. No. 12/870,760, filed on Aug. 27, 2010, entitled, Solid State Light Sheet for General Illumination, by Louis Lerman et al., incorporated herein by reference.

FIG. 4 illustrates another bidirectional light sheet, where the LED chips 44 are flip chips, with anode and cathode electrodes 46 on the bottom surface of the LED chips 44. One set of LED chips 44 are sandwiched between a top substrate 18 and a bottom substrate 14, and another set of LED chips is sandwiched between the same bottom substrate 18 and another substrate 48. Alternately, two light sheets may be separately manufactured and laminated together back-to-back. A reflector layer may be positioned between the two sets of LED chips. The LED chips in each set may be connected in any combination of series and parallel.

FIG. 5 illustrates another embodiment of a bidirectional light sheet, where the top substrate 18 and bottom substrate 14 have conductors 50 and 52 that overlap when the substrates are laminated together to form a series connection between LED chips 26. Two light sheets are laminated together with a reflective layer 53 between them to cause light to be emitted bidirectionally from the back-to-back light sheets.

FIG. 6 is a top down view of the light sheet portion of FIG. 5 showing the overlapping conductors 50 and 52 connecting the LED chips 26 in series.

The substrate electrodes over the LED chip anodes may by transparent conductors, such as ITO (indium-doped tin oxide) or ATO (antimony-doped tin oxide) layers, to avoid blocking light.

The intermediate layer between the sets of LED chips may include control electronics and/or cross-over conductors for interconnecting the LED chips and controlling brightness.

Figure 7:
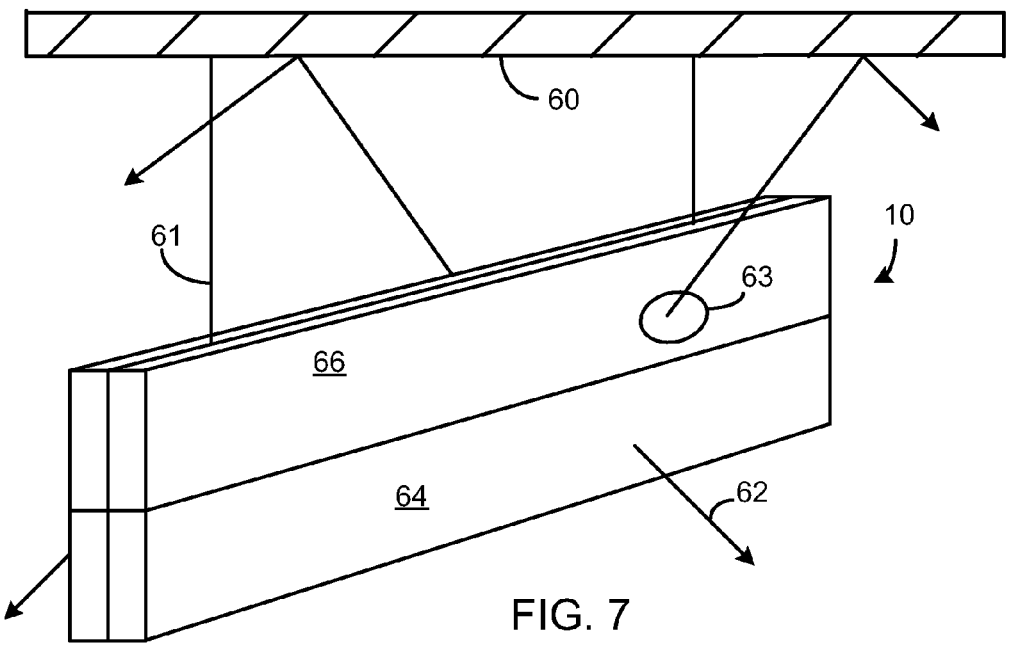
FIG. 7 is a perspective view of any of the bidirectional light sheets being orientated approximately perpendicular to a ceiling and emitting light at a variety of peak intensity angles.

FIG. 7 illustrates any of the bidirectional light sheets being suspended from a ceiling 60 by wires 61 and orientated approximately perpendicular to the ceiling 60. The wires 61 may conduct a low DC voltage (e.g., 24 volts DC) to the LED chips or may supply a mains voltage to a power converter in the luminaire. The light sheets are shown emitting light 62 at a variety of peak intensity angles. Lenses 63 may be molded in the transparent surfaces of any of the light sheets to direct the peak intensity at any angle. The lenses may be Fresnel lenses, elongated grooved lenses, or other lens shapes to achieve the desired light emission angles. Other ways of directing the light may also be used in any of the embodiments, such as locating the LED chips in reflective cups or deep wells that emit a collimated beam of light at any selected angle. This can be done by angling the cups or shaping the cups.

In FIG. 7, two, bidirectional light sheets 64 and 66 are mounted together in the same luminaire, where the light sheet 64 has lenses that generally direct light downward, and the light sheet 66 has lenses that generally direct light upward to reflect off the ceiling 60. Light from adjacent, identical luminaires merge across the floor and ceiling to create an overall smooth lighting effect. The luminaires may replace standard fluorescent lamp troffers, yet not require any space above the ceiling. This enables the luminaires to be used where the ceiling is not a drop down ceiling.

The light angles coming from both sides of the light sheet may be mirror images for symmetry or may be asymmetrical.

Instead of a flat light sheet, the light sheet may be bent to form an arc or other shape, depending on the desired emission pattern.

The light sheet may be affixed to the ceiling at non-parallel angles other than a vertical orientation, depending on the particular light effect desired. However, a symmetrical light emission for room illumination will typically be desired.

In another embodiment, there are a variety of lenses in a single light sheet to direct the light at two or more different angles. This may be used to create a very compact luminaire formed of one or more light sheets.

Many other aesthetic light patterns may be generated from the vertical orientation of the bidirectional light sheets and the types of lenses formed in the light sheets.

Figure 8:
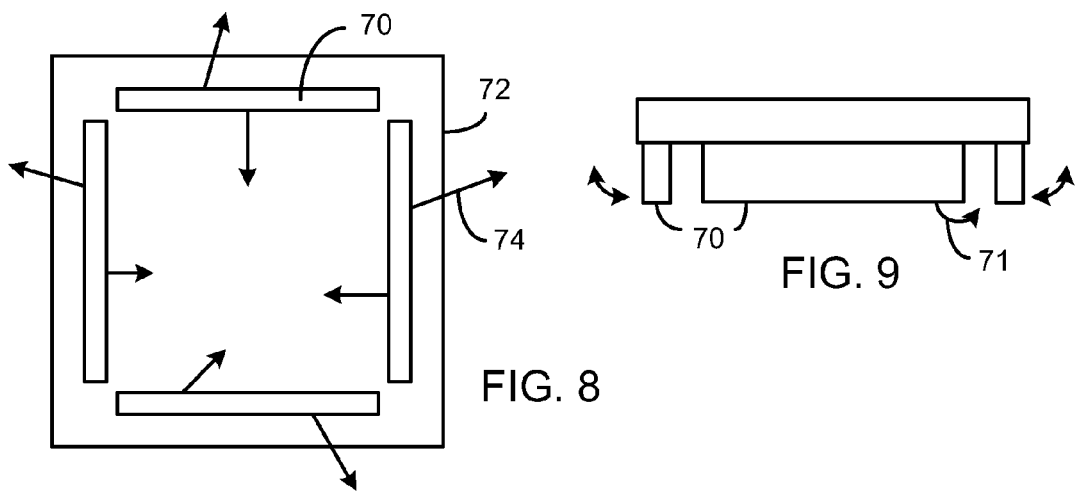
FIG. 8 is a bottom up view of a luminaire containing a plurality of the bidirectional light sheets and adjustable to emit light at a variety of peak intensity angles.
Figure 9:
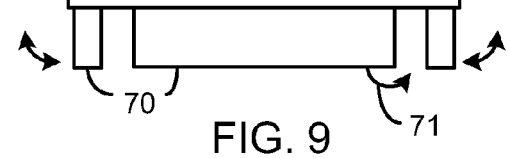
FIG. 9 is a side view of the luminaire of FIG. 8.

FIG. 8 is a bottom up view, and FIG. 9 is a side view, of a luminaire containing four bidirectional light sheets 70, which are adjustable to emit light at a variety of peak intensity angles. Each light sheet may output light at a certain downward peak intensity angle, such as 55 degrees relative to the nadir, or each light sheet may emit at a different peak intensity angle. The angles of the physical light sheets 70 may be adjusted by pivoting 71 the light sheet around an axis. For example, one edge of each light sheet may be connected to a pivoting support on the luminaire base 72. The peak intensity light rays 74 from the four light sheets 70 are shown being at different angles. Any number of light sheets 70 at any orientation (e.g., diagonal, parallel, perpendicular) may be used in the luminaire.

The bidirectionality of the flexible light sheet is very useful in hanging luminaires where it is desired to illuminate the ceiling as well as the floor. Illuminating a ceiling creates a pleasant aesthetic effect and provides more uniform lighting throughout the room. FIGS. 10-12B illustrate additional luminaires that reflect light off the ceiling.

Figure 10:
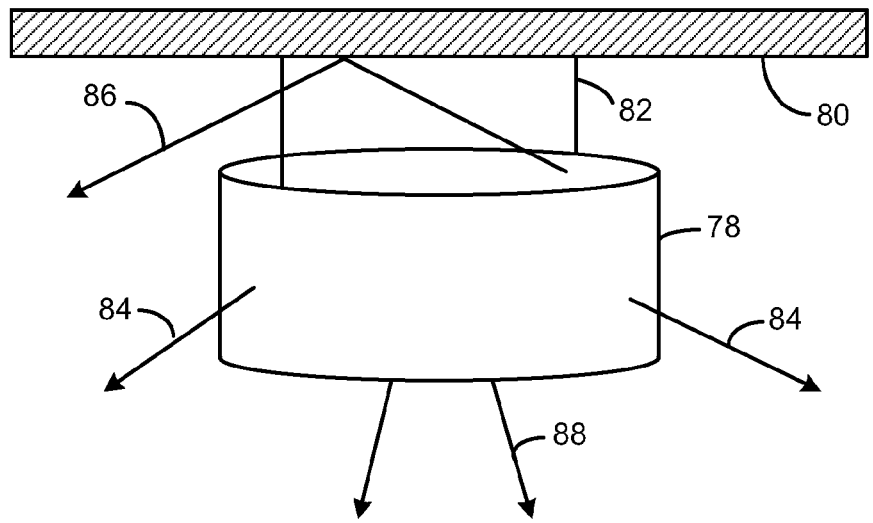
FIG. 10 is a perspective view of a bidirectional light sheet that is bent to form a cylinder, where the cylinder is suspended from a ceiling.

FIG. 10 is a perspective view of a bidirectional light sheet 78 that is bent to form a cylinder, where the cylinder is suspended from a ceiling 80. The flexible light sheet 78 may be supported along its edges by a plastic cylindrical frame that is suspended from the ceiling 80 by wires 82. The curvature of the light sheet 78 causes light to be evenly emitted 360 degrees around a central axis. The peak intensity of light may be directed downward to avoid glare by lenses or other optical means. In one embodiment, the peak intensity is at 55 degrees relative to the nadir. The light emitted from the inside surface of the cylinder is both directed upward to reflect off the ceiling 80 and downward to avoid any dark spot under the luminaire. Angled light rays 84 are shown being emitted from the outer surface of the light sheet 78. The outer surface may also emit a percentage of the light toward the ceiling 80 for more uniform illumination of the ceiling 80. An angled light ray 86 is shown being emitted from the inside surface of the light sheet 78 and reflected off the ceiling 80 to avoid a dark spot above the luminaire, and downward light rays 88 are shown being emitted from the inside surface of the light sheet 78 to avoid a dark spot under the luminaire.

Figure 11:
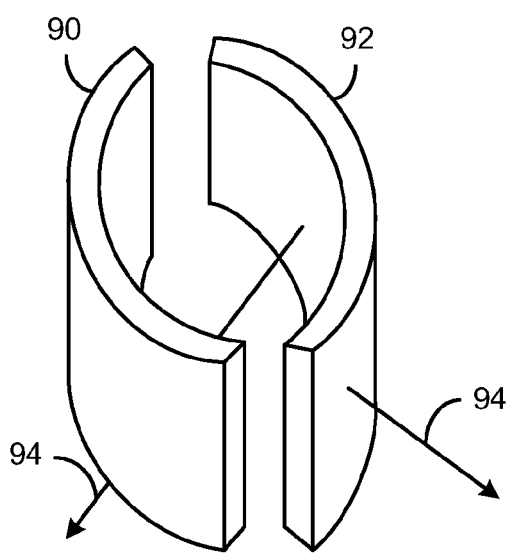
FIG. 11 illustrates two curved bidirectional light sheets that may be angled in any direction and curved to have any radius. The light sheets may be suspended from a ceiling.

FIG. 11 illustrates two curved bidirectional light sheets 90 and 92 that may be angled in any direction and curved to have any radius. The light sheets 90/92 may be suspended from a ceiling as in FIG. 10. The light sheets 90/92 may each be supported by a frame to allow each to be independently tilted and pivoted around a central axis. Since the light 94 emitted by each bidirectional light sheet 90/92 is asymmetrical, virtually any light pattern may be created by changing the angles and directions of the light sheets 90/92.

Figure 12A:
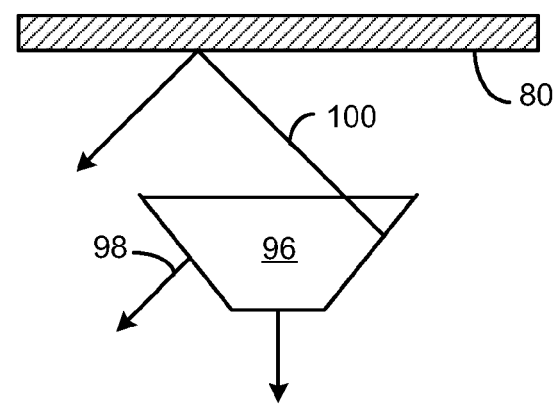
FIG. 12A is a side view of bidirectional light sheets forming a truncated pyramid, shown suspended from a ceiling.

FIG. 12A is a side view of bidirectional light sheets 96 forming a truncated pyramid, shown suspended from a ceiling 80. The light sheets 96 are directed at a downward angle, such as at a 55 degree angle, to direct light 98 downward. This provides 360 degree coverage of the floor. To avoid any dark spot above the luminaire and to illuminate the ceiling well beyond the area of the light sheets 96, the inside surfaces of the light sheets 96 direct light 100 toward the ceiling 80. A light sheet 96 may form the flat bottom surface of the luminaire, or the bottom may be open for increased air circulation.

Figure 12B:
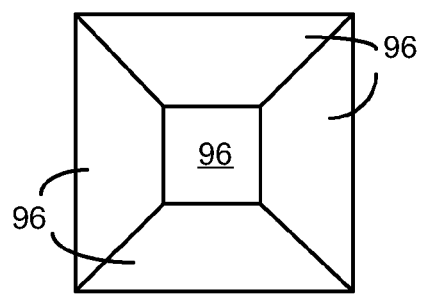
FIG. 12B is a bottom up view of the luminaire of FIG. 12A.

FIG. 12B is a bottom up view of the luminaire of FIG. 12A. The light sheets 96 may be at any angle, such as to minimize glare. Lenses in the light sheet surfaces may be used to direct the light emission.

Other uses of a non-parallel oriented bidirectional light sheet are also envisioned.

The various features of all embodiments may be combined in any combination.

While particular embodiments of the present invention have been shown and described, it will be obvious to those skilled in the art that changes and modifications may be made without departing from this invention in its broader aspects and, therefore, the appended claims are to encompass within their scope all changes and modifications that fall within the true spirit and scope of the invention.

What is claimed is:

1. A bidirectional lighting device for general illumination comprising:

a first plurality of first non-packaged light emitting diode (LED) dies arranged to emit light in a first direction and having electrodes;

a second plurality of second non-packaged light emitting diode (LED) dies arranged to emit light in a second direction different from the first direction and having electrodes;

at least a first substrate and a second substrate sandwiching the first plurality and second plurality of LED dies and forming a light emitting structure having a first light emitting surface outputting light from the lighting device in the first direction and an opposing second light emitting surface outputting light from the lighting device in the second direction different from the first direction;

conductors formed on at least one of the first substrate and second substrate electrically connected to the electrodes of the first plurality and the second plurality of LED dies without wires for connecting the first plurality and the second plurality of LED dies to a source of power; and wherein the first substrate and the second substrate form a bidirectional light sheet, and wherein the light sheet is affixed proximate to a ceiling such that the first and second light emitting surfaces are not parallel to the ceiling, and wherein some light from the bidirectional light sheet is directed towards the ceiling and some light from the bidirectional light sheet is directed towards a floor;

wherein the first substrate has first connection locations electrically connected to first conductors formed on the first substrate, wherein each of the first plurality and the second plurality of LED dies has at least a first die electrode and a second die electrode, the first die electrode being formed on a primary light output surface of the LED die, wherein some of the first plurality and the second plurality of LED dies have their first die electrode aligned with and electrically connected to an associated one of the first connection locations on the first substrate without wire bonds, wherein the second substrate has second connection locations electrically connected to second conductors formed on the second substrate, wherein other ones of the first plurality and second plurality of LED dies have their first die electrode aligned with and electrically connected to an associated one of the second connection locations on the second substrate without wire bonds, and wherein the first substrate and the second substrate have light output surfaces for emitting light in opposing directions from at least the primary light output surfaces of the first plurality and the second plurality of LED dies.

2. The device of claim 1 wherein the light sheet is affixed to the ceiling such that the first and second light emitting surfaces are substantially perpendicular to the ceiling.

3. The device of claim 1 wherein the light sheet is suspended from the ceiling by wires such that the first and second light emitting surfaces are substantially perpendicular to the ceiling.

4. The device of claim 1 wherein an angle of the light sheet relative to the ceiling is adjustable.

5. The device of claim 1 further comprising lenses in the device that direct a peak intensity of light at a certain angle relative to the ceiling.

6. The device of claim 1 wherein the light sheet is one of a plurality of light sheets in a luminaire, wherein at least two of the light sheets emit a peak intensity of light at different angles.

7. The device of claim 1 further comprising two or more different optical elements in the device that direct light at different angles relative to the ceiling.

8. The device of claim 1 further comprising one or more intermediate layers between the first substrate and the second substrate.

9. The device of claim 1 wherein the first substrate and the second substrate directly contact each other with no intermediate layer between them.

10. The device of claim 1 further comprising at least a third substrate sandwiched between the first substrate and the second substrate, the third substrate having a reflective layer for reflecting light out through the first substrate and the second substrate.

11. The device of claim 1 further comprising a reflective layer between the first substrate and the second substrate, wherein some of the first plurality and the second plurality of LED dies are located between the reflective layer and a light output surface of the first substrate, and other ones of the first plurality and the second plurality of LED dies are located between the reflective layer and a light output surface of the second substrate.

12. The device of claim 1 wherein the light sheet is one of a plurality of light sheets in a luminaire, wherein a first side of the luminaire emits light from a first light sheet at a first peak intensity angle and emits light from a second light sheet at a second peak intensity angle, different from the first peak intensity angle.

13. The device of claim 12 wherein a second side of the luminaire, opposite the first side of the luminaire, emits light from a third light sheet at the first peak intensity angle and emits light from a fourth light sheet at a fourth peak intensity angle, different from the third peak intensity angle.

14. The device of claim 1 wherein at least some of the first plurality and the second plurality of LED dies are connected in series by the first conductors and the second conductors.

15. The device of claim 14 wherein the at least some of the first plurality and the second plurality of LED dies are connected in series by the first conductors and the second conductors interconnecting the first die electrodes to the second die electrodes.

16. The device of claim 1 wherein the bidirectional light sheet is curved and suspended from the ceiling.

17. The device of claim 16 wherein the bidirectional light sheet substantially forms a cylinder having sides substantially perpendicular to the ceiling.

* * * * *